(12) United States Patent
Tsai et al.

(10) Patent No.: US 8,470,714 B1
(45) Date of Patent: Jun. 25, 2013

(54) METHOD OF FORMING FIN STRUCTURES IN INTEGRATED CIRCUITS

(75) Inventors: Shih-Hung Tsai, Tainan (TW); Ssu-I Fu, Kaohsiung (TW); Chien-Liang Lin, Taoyuan County (TW); Ying-Tsung Chen, Kaohsiung (TW); Ted Ming-Lang Guo, Tainan (TW); Chin-Cheng Chien, Tainan (TW); Chien-Ting Lin, Hsinchu (TW); Wen-Tai Chiang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/477,079

(22) Filed: May 22, 2012

(51) Int. Cl.
*H01L 21/311* (2006.01)

(52) U.S. Cl.
USPC .......................................................... 438/699

(58) Field of Classification Search
USPC .......................................................... 438/699
See application file for complete search history.

(56) References Cited

U.S. PATENT DOCUMENTS

| | | | |
|---|---|---|---|
| 4,470,874 A * | 9/1984 | Bartush et al. ................ 438/631 |
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Shaheen | |
| 2004/0195624 A1 | 10/2004 | Liu | |
| 2005/0051825 A1 | 3/2005 | Fujiwara | |
| 2005/0145932 A1 * | 7/2005 | Park et al. ...................... 257/328 |
| 2006/0099830 A1 | 5/2006 | Walther | |
| 2006/0286729 A1 | 12/2006 | Kavalieros | |
| 2007/0004129 A1 * | 1/2007 | Lee et al. ....................... 438/243 |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2008/0233699 A1 * | 9/2008 | Booth et al. ................... 438/283 |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |

(Continued)

OTHER PUBLICATIONS

Redolfi, A., Bulk FinFET fabrication with new approaches for oxide topography control using dry removal techniques, Mar. 14-16, 2011, Ultimate Integration on Silicon (ULIS) 2011 12th International Conference, Cork Ireland.

*Primary Examiner* — Jae Lee
*Assistant Examiner* — Grant Withers
(74) *Attorney, Agent, or Firm* — Winston Hsu; Scott Margo

(57) ABSTRACT

A method of forming fin structure in integrated circuit comprising the steps of forming a plurality of fin structures on a substrate, covering an insulating layer on said substrate, performing a planarization process to expose mask layers, performing a wet etching process to etch said insulating layer, thereby exposing a part of the sidewall of said mask layer, removing said mask layer, and performing a dry etching process to remove pad layer and a part of said insulating layer, thereby exposing the top surface and a part of sidewall of said fin structures.

10 Claims, 4 Drawing Sheets

U.S. PATENT DOCUMENTS

| | | |
|---|---|---|
| 2010/0072553 A1 | 3/2010 | Xu |
| 2010/0144121 A1 | 6/2010 | Chang |
| 2010/0167506 A1 | 7/2010 | Lin |
| 2011/0097889 A1 | 4/2011 | Yuan |
| 2012/0211807 A1* | 8/2012 | Yu et al. .......... 257/288 |
| 2012/0248529 A1* | 10/2012 | Liu et al. .......... 257/334 |
| 2013/0023095 A1* | 1/2013 | Nojima .......... 438/268 |
| 2013/0043563 A1* | 2/2013 | Nakazawa .......... 257/607 |
| 2013/0045576 A1* | 2/2013 | Tsai et al. .......... 438/151 |
| 2013/0045580 A1* | 2/2013 | Cho .......... 438/296 |
| 2013/0056826 A1* | 3/2013 | Liu et al. .......... 257/347 |
| 2013/0056837 A1* | 3/2013 | Ng et al. .......... 257/410 |

\* cited by examiner

METHOD OF FORMING FIN STRUCTURES IN INTEGRATED CIRCUITS

BACKGROUND OF THE INVENTION

1. Field of the Invention

The present invention relates generally to a method of forming integrated circuit structures. In particular, the present invention relates to a method of forming fin structures in integrated circuits.

2. Description of the Prior Art

In recent years, as various kinds of consumer electronic products are constantly improved and miniaturized, the size of the semiconductor components have accordingly reduced, in order to meet requirements of high integration, high performance, and low power consumption.

With the trend in the industry being towards scaling down the size of the metal oxide semiconductor transistors (MOS), three-dimensional or non-planar transistor technology, such as fin field effect transistor technology (Fin FET) have been developed to replace the planar MOS transistors. The three-dimensional structure of a fin FET increases the overlapping area between the gate and the fin structure of the silicon substrate, the channel region is therefore accordingly more effectively controlled. The drain-induced barrier lowering (DIBL) effect and the short channel effect are therefore reduced. The channel region is also longer for an equivalent gate length, thereby increasing the current between the source and the drain. In addition, the threshold voltage of the fin FET can be controlled by adjusting the work function of the gate.

To manufacture non-planar FET device, numerous protruding and parallel fin structures must be formed firstly on semiconductor substrate, and deposition, planarization, and etch back processes are then performed on the substrate to form shallow trench isolations (STI) between the fin structures. The height of the fin structure is also defined in this step. During the formation of the fin structures, the etch back process is commonly used in a conventional approach by using diluted hydrofluoric (DHF) acid to etch the STI structures between the fin structures until a predetermined depth is reached, thereby forming the fin structures. However, some disadvantages are found in the fin structures formed by using the conventional approach. For example, the width difference of top surface and bottom surface of the fin structure is larger (ex. larger than 1 nm), the corner of fin structures and surrounding STI structures will have significant wicking features (ex. the height difference between the top surface of the STI adjacent to the fin structure and the top surface of the STI away from the fin structure may exceed 40 Å), and the top surface of resulting fin structures may not be provided with corner rounding feature, so that additional $H_2$ annealing process is necessary to obtain a corner rounding feature. The above-mentioned disadvantages may impact the performances of resulting non-planar FET devices, or may increase the production time and costs.

Accordingly, the present invention is directed to improve the above-mentioned conventional method in order to obtain better fin structures and simplify the process steps.

SUMMARY OF THE INVENTION

To improve the above-mentioned drawbacks of the prior art, a new semiconductor process is provided in the present invention. The method of the present invention features the steps of performing an etching process to etch the shallow trench isolations (STI) surrounding the fin structures until a predetermined depth is reached, and performing a SiCoNi dry etching process using HF and $NH_3$ based process gases to define the height of fin structures. The fin structures formed by the method of the present invention will have better profiles, which may improve the electrical properties of the non-planar field effect transistor (FET) formed in later processes.

One object of the present invention is to provide a method of forming fin structure in integrated circuit comprising the steps of forming a plurality of fin structures on a substrate, covering an insulating layer on said substrate, performing a planarization process to expose mask layers, performing a wet etching process to etch said insulating layer, thereby exposing a part of the sidewall of said mask layer, removing said mask layer, and performing a dry etching process to remove pad layer and a part of said insulating layer, thereby exposing the top surface and a part of sidewall of said fin structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
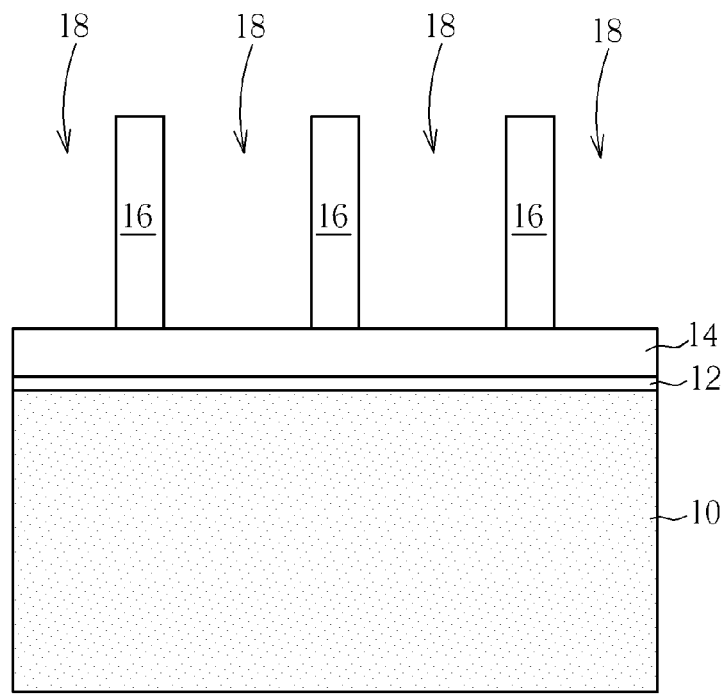
FIGS. 1-8 are cross-sectional views illustrating the process flow of forming fin structures in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part thereof, and in which are shown specific embodiments in which the invention may be practiced by way of illustration. These embodiments are described in sufficient details to allow those skilled in the art to practice the invention. Other embodiments may be utilized and structural, logical, and electrical changes may be made without departing from the scope of the present invention.

The embodiments will now be explained with reference to the accompanying drawings to provide a better understanding of the process of the present invention, wherein FIGS. 1-8 are cross-sectional views illustrating the flow of forming fin structures in integrated circuits in accordance to one embodiment of the present invention.

First, please refer to FIG. 1, wherein a semiconductor substrate 10 is provided. In an embodiment, the semiconductor substrate 10 includes silicon. Other commonly used materials, such as carbon, germanium, gallium, arsenic, nitrogen, indium, and/or phosphorus, and the like, may also be included in the semiconductor substrate 10. The semiconductor substrate 10 may be a bulk substrate.

A pad layer 12 and a mask layer 14 may be formed on the semiconductor substrate 10. The pad layer 12 may be a thin film comprising silicon oxide formed through a thermal oxidation process for example. The pad layer 12 may act as an adhesive layer between the semiconductor substrate 10 and the mask layer 14. The pad layer 12 may also act as an etch stop layer for the etching mask layer 14. In an embodiment, the mask layer 14 is made of silicon nitride and formed through a low-pressure chemical vapor deposition (LPCVD) process for example. In other embodiments, the mask layer 14 is formed by thermal nitridation of silicon, plasma enhanced chemical vapor deposition (PECVD), or plasma anodic nitridation. The mask layer 14 is used as a hard mask during subsequent photolithography processes. A photo resist 16 is formed on the mask layer 14 and is then patterned to form openings 18 and to expose the underlying mask layer 14.

Figure 2:
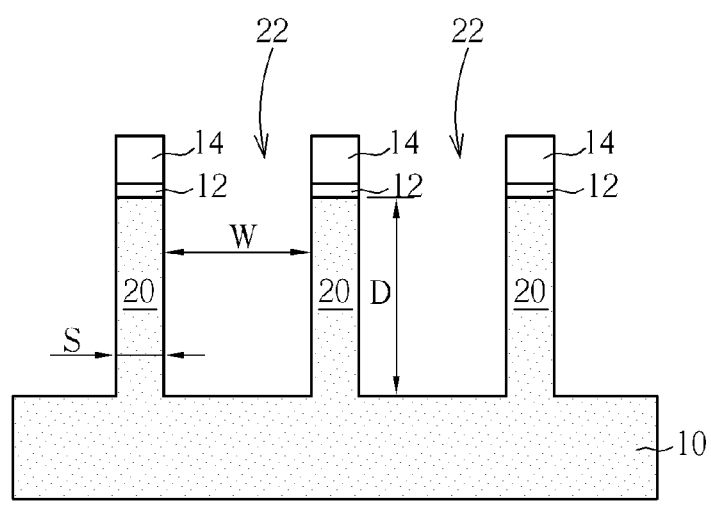

Please refer to FIG. 2, wherein the mask layer 14 and the pad layer 12 are patterned by etching through openings 18, exposing the underlying semiconductor substrate 10. The exposed semiconductor substrate 10 is then etched by using patterned mask layer 14 as hard mask to form trenches 22. The portions of the semiconductor substrate 10 between the trenches 22 form semiconductor strips 20 parallel to each other (in the top view). The photo resist 16 is then removed after the etching process. Then, a cleaning process may be performed to remove a native oxide of semiconductor substrate 10. The cleaning process may be performed by using diluted hydrofluoric (DHF) acid.

In an embodiment of present invention, a depth D of the trenches 22 may be between about 2100 Å and about 2500 Å, while a width W is between about 300 Å and about 1500 Å. In an exemplary embodiment, the aspect ratio (D/W) of the trenches 22 is greater than 7.0. The width S of the semiconductor strips 20 may be smaller than about 30 nm. One skilled in the art will however realize that the dimensions and the values recited throughout the descriptions are merely examples, and may be changed to fit different scales of integrated circuits.

Figure 3:
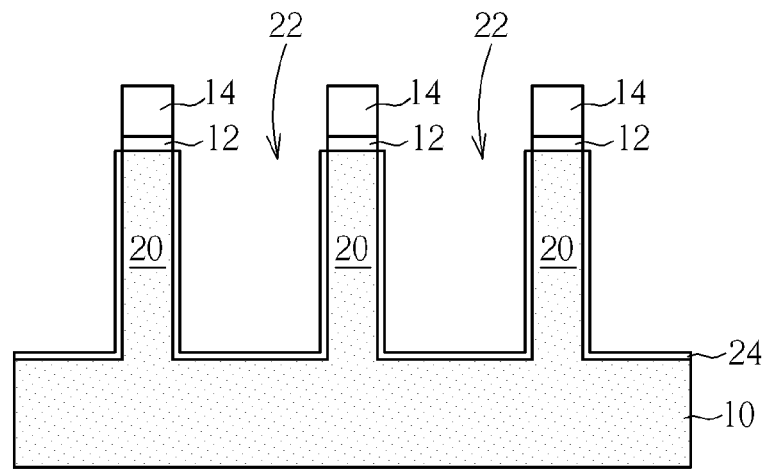

A liner layer 24 is then formed in the trenches 22, as shown in FIG. 3. In an embodiment, the liner layer 24 may be a thermal oxide having a thickness between about 20 Å to about 500 Å. In other embodiments, the liner layer 24 may be formed using in-situ steam generation (ISSG). In yet other embodiments, the liner layer 24 may be formed by using a deposition technique that can form conformal oxide layers, such as selective area chemical vapor deposition (SACVD) processes and the likes. Besides, the liner layer 24 may be a single layer or a composite layer including Si—O compound and/or Si—N compound. The formation of the liner oxide 24 rounds the corners of the trenches 22, which reduces the electrical fields, and hence improves the performances of the resulting integrated circuits.

Figure 4:
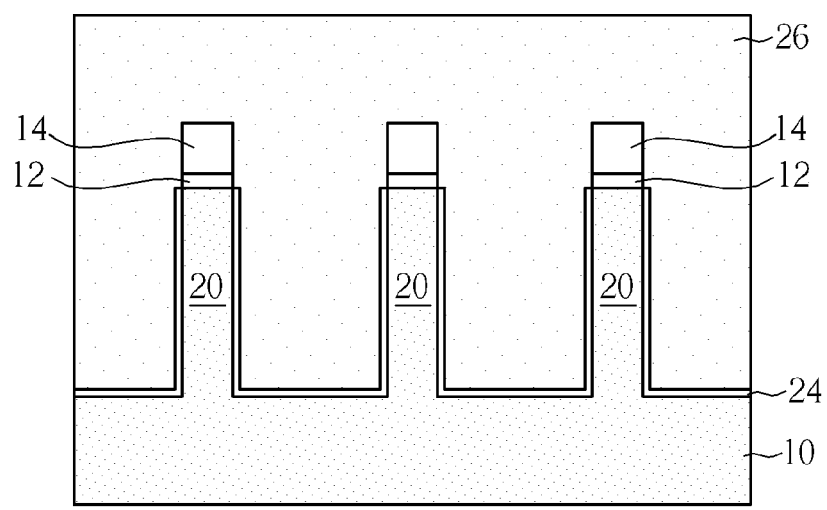

Please refer to FIG. 4, wherein the trenches 22 are filled with a dielectric material 26. The dielectric material 26 (also referred as an insulating layer) may include silicon oxide, although other dielectric materials, such as SiN, SiC, or the likes, may also be used. In an embodiment, the dielectric material 26 is formed using a high aspect-ratio process (HARP), wherein process gases may include tetraethylorthosilicate (TEOS) and $O_3$. In an embodiment, as shown in FIG. 4, the dielectric material 26 may cover the whole semiconductor substrate 10, including the semiconductor strips 20. The dielectric material 26 may have a non-planar surface higher than the top surface of the mask layer 14.

Figure 5:
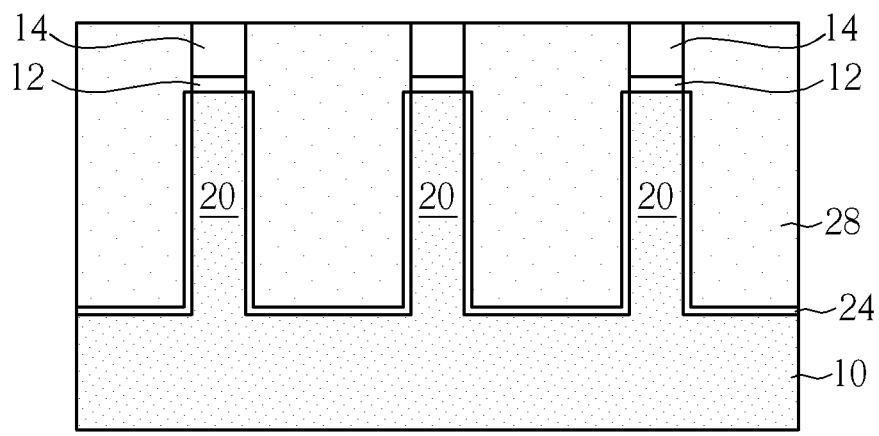

A planarization process, such as chemical mechanical polish (CMP), is then performed to remove parts of the dielectric material 26 after the covering of dielectric material 26. The planarization process will expose the underlying mask layer 14, and the resulting structure is shown in FIG. 5. The top surfaces of mask layer 14 and dielectric material 26 form a substantially planar surface. The remaining portions of the dielectric material 26 and liner layer 24 in the trenches 22 are referred to as shallow trench isolation (STI) 28 between the semiconductor strips.

Figure 6:
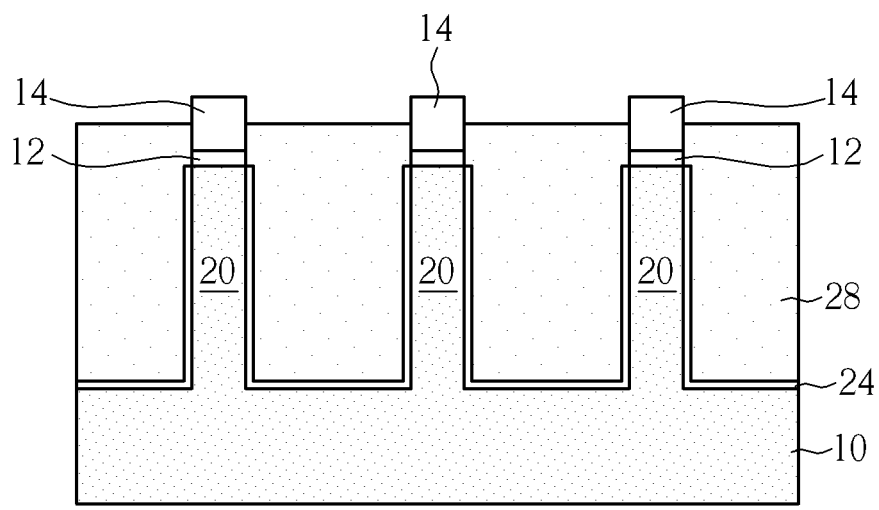

Please refer to FIG. 6, wherein a first etching process is performed to etch the STI 28 after the exposure of the mask layer 14. In an embodiment of present invention, the first etching process may be a wet etching process using diluted HF acid if the material of the STI 28 is silicon oxide. This etching process may etch parts of the STI 28 until the top surface of the STI 28 is higher than the bottom surface of the mask layer 14 and lower than the top surface of the mask layer 14. This may also expose parts of sidewalls of the mask layer 14. Preferably, the top surface of the STI 28 is at the same level as half of the thickness of the mask layer 14.

Figure 7:
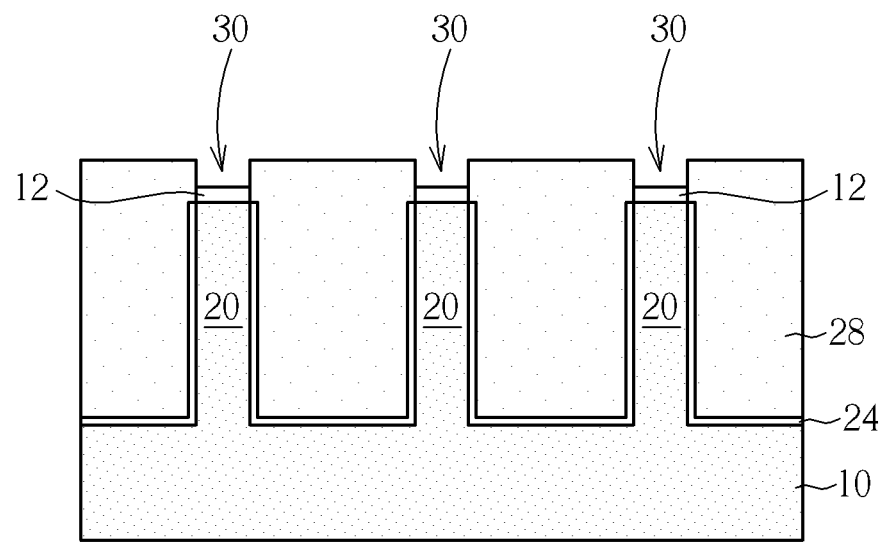

Please refer to FIG. 7, wherein the exposed mask layer 14 is removed after completing the first etching process. In an embodiment of the present invention, the mask layer 14 may be removed by a wet etching process using hot $H_3PO_4$ if the material of the mask layer 14 is silicon nitride. Since the mask layer 14 at this stage is protruding higher than the STI 28, a recess 30 may be defined by the STI 28 and the pad layer 12 in between after the removal of the mask layer 14. At this stage, the top surface of the pad layer 12 is lower than the top surface of the STI 28.

Figure 8:
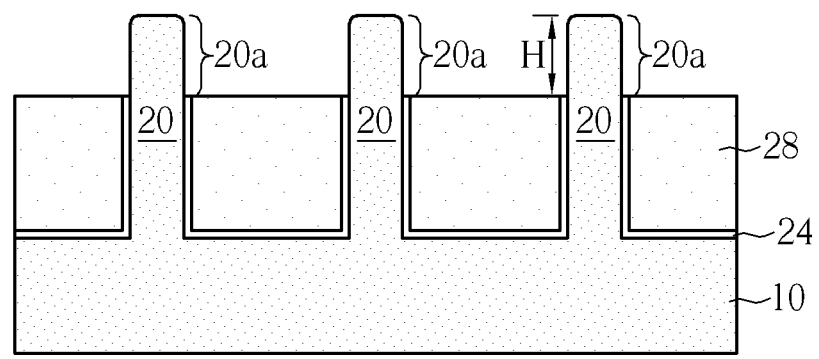

Please refer to FIG. 8, wherein a second etching process is performed to remove the pad layer 12 above the semiconductor strips 20 and parts of the STI 28 after the removal of the mask layer 14. The second etching process will etch the STI 28 until a predetermined depth is reached. The semiconductor strips 20 may then protrude higher than the STI 28. The fin structure 20a with a predetermined height H is now defined. This etching process may also etch the liner layer 24 on the sidewalls of the fin structures 20a. In an embodiment of the present invention, since the thickness of the pad layer 12 above the semiconductor strip 20 is much thinner than the thickness of the STI 28 removed by the second etching process, the pad layer 12 will be completely removed during the second etching process, and even parts of the semiconductor strip 20 will be etched. This way a fin structure 20a with top corner rounding features can be obtained. For example, the height difference between the top surface of the STI adjacent to the fin structure and the top surface of the STI away from the fin structure may be controlled at the value lower than 40 Å. The SiCoNi process primarily includes the step of reacting the fluorine-containing gas with the silicon oxide to synthesize diammonium fluosilicate (($NH_4)_2SiF_6$). In this way, the silicon oxide can be removed optionally. The aforesaid fluorine-containing gas can be hydrogen fluoride (HF) or nitrogen trifluoride ($NF_3$).

In an embodiment of present invention, the second etching process may be a dry etching process to etch the STI 28 until a predetermined depth is reached. Preferably, the process gas used in this dry etching process includes H atoms, for example, using hydrofluoric (HF) and ammonia ($NH_3$) based process gases to etch the substrate. Therefore, in an embodiment of present invention, a selective material removing technology (named as SiCoNi™ process) developed by Applied Materials may be utilized in present invention. This process may effectively remove the dielectric material 26 in the present invention and may also better control the height H of fin structures 20a. Also, the wicking effect at the corner of fin structure 20a and the surrounding STI 28 may be significantly improved.

Furthermore, thanks to the approach of keeping the top surface of the STI 28 higher than the pad layer 12 before the second etching process in the present invention, the width difference between the top surface and the bottom surface of the fin structure 20a will be smaller (ex. lower than 1 nm), and the top surface of the fin structure 20a will be provided with a corner rounding feature. No additional $H_2$ annealing process is required in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming fin structures in integrated circuits, comprising the steps of:
    forming a plurality of fin structures on a substrate, wherein a pad layer and a mask layer are formed on the top surface of each said fin structure;
    forming an insulating layer on said substrate;
    performing a planarization process to remove parts of said insulating layer to expose said mask layer;
    performing a wet etching process to etch said insulating layer to expose parts of the sidewalls of said mask layer;
    removing said mask layer to expose said pad layer; and
    performing a dry etching process to remove said pad layer and parts of said insulating layer to expose the top surface and parts of the sidewalls of said fin structure.

2. A method of forming fin structures in integrated circuits according to claim 1, wherein said wet etching process is performed to etch said insulating layer so that the top surface of said insulating layer is higher than the bottom surface of said mask layer and is lower than the top surface of said mask layer.

3. A method of forming fin structures in integrated circuits according to claim 2, wherein said wet etching process is performed to etch said insulating layer so that the top surface of said insulating layer is at the same level as half of the thickness of said mask layer.

4. A method of forming fin structures in integrated circuits according to claim 1, wherein said wet etching process is a wet etching process using diluted hydrofluoric (DHF) acid.

5. A method of forming fin structures in integrated circuits according to claim 1, wherein said dry etching process is a dry etching process using hydrofluoric (HF) gas and ammonia ($NH_3$) gas.

6. A method of forming fin structures in integrated circuits according to claim 1, further comprises forming a liner layer on the surface of said fin structure after the step of forming said a plurality of fin structures.

7. A method of forming fin structures in integrated circuits according to claim 1, wherein said mask layer comprises a silicon nitride (SiN) layer.

8. A method of forming fin structures in integrated circuits according to claim 1, wherein said pad layer comprises silicon oxide ($SiO_2$) layer.

9. A method of forming fin structures in integrated circuits according to claim 1, wherein said insulating layer comprises a silicon oxide ($SiO_2$) layer.

10. A method of forming fin structures in integrated circuits according to claim 1, wherein the top surface of said exposed fin structure after performing said dry etching process is rounded.

* * * * *